(12) United States Patent
Houge et al.

(10) Patent No.: US 6,651,226 B2
(45) Date of Patent: Nov. 18, 2003

(54) PROCESS CONTROL USING THREE DIMENSIONAL RECONSTRUCTION METROLOGY

(75) Inventors: Erik Cho Houge, Orlando, FL (US); John Martin McIntosh, Orlando, FL (US); Larry E. Plew, St. Cloud, FL (US)

(73) Assignee: Agere Systems, Inc., Allentown, PA (US)

( * ) Notice: Subject to any disclaimer, the term of this patent is extended or adjusted under 35 U.S.C. 154(b) by 68 days.

(21) Appl. No.: 09/967,114

(22) Filed: Sep. 28, 2001

(65) Prior Publication Data

US 2002/0170021 A1 Nov. 14, 2002

Related U.S. Application Data

(60) Provisional application No. 60/275,193, filed on Mar. 12, 2001.

(51) Int. Cl.[7] .............................................. G06F 17/50
(52) U.S. Cl. ..................................... 716/4; 716/5; 716/1
(58) Field of Search .............................. 716/1, 4, 2, 3, 716/5, 6; 430/30, 31, 32, 1; 606/5

(56) References Cited

U.S. PATENT DOCUMENTS

| | | | | | |
|---|---|---|---|---|---|
| 5,362,585 | A | * | 11/1994 | Adams | 430/30 |
| 5,968,693 | A | * | 10/1999 | Adams | 430/30 |
| 5,981,119 | A | * | 11/1999 | Adams | 430/30 |
| 5,989,764 | A | * | 11/1999 | Adams | 430/30 |
| 6,056,739 | A | * | 5/2000 | Klopotek | 606/5 |
| 6,500,591 | B1 | * | 12/2002 | Adams | 430/30 |

* cited by examiner

Primary Examiner—Vuthe Siek
Assistant Examiner—Binh C. Tat
(74) Attorney, Agent, or Firm—David G. Maire; Beusse Brownlee Bowdoin & Wolter, P.A.

(57) ABSTRACT

In-line process control for 120 nm and 100 nm lithography using the installed scanning electron microscope (SEM) equipment base. A virtual three-dimensional representation of a photoresist feature is developed by applying a transform function to SEM intensity data representing the feature. The transform function correlates highly accurate height vector data, such as provided by a stylus nanoprofilometer or scatterometer, with the highly precise intensity data from the SEM. A multiple parameter characterization of at least one critical dimension of the virtual feature is compared to an acceptance pattern template, with the results being used to control a downstream etch process or an upstream lithography process. A multiple parameter characteristic of a three dimensional representation of the resulting post-etch final feature may be compared to device performance data to further refine the acceptance pattern template.

20 Claims, 9 Drawing Sheets

PROCESS CONTROL USING THREE DIMENSIONAL RECONSTRUCTION METROLOGY

This application claims benefit of the Mar. 12, 2001, filing date of U.S. provisional patent application No. 60/275,193.

BACKGROUND OF THE INVENTION

The present invention relates generally to the field of process control and more particularly to the integration of metrology and process control.

Quality control for the production of microelectronic devices, such as integrated circuit features formed on semiconductor substrate wafers, often depends upon the accurate measurement of the dimensions of various features formed over the substrate surface. Accurate measurement of the topography of the surface of the substrate facilitates not only a pass/fail inspection routine, but also provides a basis for feedback control of upstream processes and feed forward control of downstream processes.

The desire for precise measurement of the surface topography of a microelectronics device must be tempered by the cost and time involved in obtaining such information. At one extreme, destructive examination of a semi-conductor wafer may reveal precise dimensional information at the expense of a useable wafer and many hours of delay time.

The size of semiconductor devices continues to decrease and the metrology used to measure such devices must respond accordingly. There are many types of both optical and electron based metrology tools available, such as scanning electron microscope (SEM), focused ion beam microscope, focused x-ray microscope and focused optical microscopes including near-field scanning optical microscopy. As the size of devices has decreased, optical imaging metrology for critical dimensions has been abandoned. The scanning electron microscope currently plays a major role for metrology in the semiconductor manufacturing industry. Modem 157 nm lithography technology pushes the limits of top down critical dimension scanning electron microscopes (CDSEM). The technology critical dimension nodes of 120 nm and 100 nm lithography will require more precision and accuracy than the SEM appears to be able to provide while utilizing current technologies.

The critical dimension scanning electron microscope utilizes algorithms based upon the intensity of line scan profiles of images to extract the apparent width of features. While the CDSEM offers quick and repeatable measurements of the intensity profiles of features, it remains difficult to establish the exact morphology of the feature from a top down plan view perspective. This is, in part, due to the extensive electron beam interactions within the specimen. That is, the CDSEM will measure the intensity of the secondary electron signal from pixel to pixel across the sample surface. If a particular feature is flat, e.g. the top of a feature or the bottom of a trench, then the secondary electron signal will be constant as long as the surface material remains constant. When the interaction volume that intersects with the surface area of the material changes, the intensity of the secondary electrons that escape from the surface will also change. This topographic effect results in edge effects that blur the image at locations of morphology change. This blurring produces an uncertainty in the critical dimension measurement. While the shape of the intensity profiles respond to drastic changes in morphology, more subtle changes may be lost within the intensity profiles. When intensity profiles are averaged down a plurality of scan lines, additional feature information may be lost.

A CDSEM is used to develop a top down image as shown in FIGS. 1A and 1B. These images represent an intensity of secondary electrons across the plane of the substrate surface I(x,y). FIG. 1A is an SEM image for a semiconductor wafer I-line metal photoresist having a normal morphology, and FIG. 1B is an SEM image for a similar photoresist having an abnormal morphology. An amplitude modulated waveform P(x) may be constructed as a function of this topographic information by averaging I(x,y) over N number of lines using Equation 1:

$$P(x) = \frac{\sum_{y=1}^{N} I(x, y)}{N} \quad (1)$$

FIGS. 2A and 2B illustrate the function P(x) as an amplitude modulated waveform representing the average intensity developed from the normal and abnormal photoresist lines of FIGS. 1A and 1B respectively. Known algorithms may be applied to these waveforms to identify critical dimensions, such as the width of the line at 50% wall height, as identified by dashed lines in FIGS. 2A and 2B. Many processes in the semiconductor industry have relied upon this single parameter characterization of the SEM data. Note, however, that single parameter characterization of the data may fail to discern a difference between normal and abnormal morphologies, for example, when both structures have the same critical dimension of 0.684 um as illustrated in FIGS. 2A and 2B.

Multiple parameter characterization (MPC) refers to the use of functions or groups of measurements where a singular discrete measurement can no longer effectively represent the data. MPC is being developed in many different forms for application to scanning electron microscope data in an attempt to address the shortcomings of single parameter characterization, as described above. The shape and scale of the amplitude modulated waveform P(x) can be described through multiple parameters. FIG. 3 illustrates an amplitude modulated waveform P(x) divided into two portions. The distance between the left and right regions of the waveform in solid lines defines a width measurement W and the distance between the left and right regions of the waveform in dashed lines defines a line space measurement S. At discrete intervals along the height of these regions a measurement may be taken for the width and line space, then plotted as a function of height, as shown in FIG. 4. Curve $W_N$-$S_N$ represents the MPC of the normal morphology of FIGS. 1A and 2A. Curve $W_A$-$S_A$ represents the MPC of the abnormal morphology of FIGS. 1B and 2B. Here the difference between the normal and abnormal morphologies is readily apparent. Other derived MPC values may be used to illustrate deviations from normal profiles, such as roughness measured as the 3-sigma value of the difference between the maximum and minimum critical dimension values along a line profile. Roughness may be useful for illustrating the abnormal photoresist profile known as scumming, where the resist removal fails to clear the resist between developed photoresist lines.

A database of MPC curves such as shown in FIG. 4 may be established for a particular device/process. Preset process margin templates may be established to define acceptable ranges for the MPC values for the evaluation of subsequently manufactured devices. While this quality control procedure is much improved when compared to single parameter evaluation of inspection data, it suffers from the shortcomings of any database driven system. Such shortcomings include a heavy reliance on numeric processing and a resultant lack of speed and a lack of flexibility that requires the establishment of an entirely new database each time a change is made to the process/device.

Another technique for nondestructively examining microelectronics devices is scanning probe microscopy (SPM). SPM includes various techniques of metrology wherein a probe tip is used to study the surface topography or properties of the surface of a substrate. One such device is the atomic force microscope (AFM). Another such device is the stylus nanoprofilometer (SNP) which has emerged recently as a potential tool for critical dimension metrology for both masks and 157 nm integrated circuit technology. An SNP probe tip makes contact with the substrate with only a small force at only discrete pixel points, thus minimizing the probe wear problems associated with atomic force microscopy, where a probe tip continuously touches, or nearly touches, the surface between points. The SNP probe tip is then retracted from the surface a distance sufficient to clear vertical features, moved horizontally a preset distance, and then moved back toward the surface. The vertical resolution is currently 0.3 nm or less. The distance between pixels determines the scan resolution, which currently may be as small as 1.0 nm. The scan time will be the product of time per pixel and the number of pixels. It is possible to obtain precise and accurate three dimensional topographical information with a stylus nanoprofilometer by collecting multiple adjacent line scans. However, a major disadvantage of the SNP is a lack of speed in collecting topographic information.

Scatterometers are currently being proposed for use in the semiconductor industry to provide high speed two dimensional topographic information. These devices are able to determine a cross-section but are unable to determine how that cross-section varies as a function of distance down a line. While such devices provide the promise of improved metrology for small microelectronics devices, they represent a radical change in the equipment base for the semiconductor manufacturing industry. There is some question whether the benefits achievable with modem scatterometers will justify the capital investment necessary to achieve such benefits.

Thus, three technologies are emerging for in-line metrology for semiconductor manufacturing applications. CDSEM is able to provide 3-dimensional information of x-y verses electron intensity, but electron intensity does not correlate easily to feature height. SPM-based tools are able to provide 3-dimensional information of x-y verses height, but they do so at very slow speeds. Scatterometers are able to provide 2-dimensional information of x or y verses height, but they are unable to determine localized information as the values are statistically determined over a large area.

BRIEF SUMMARY OF THE INVENTION

There is a particular need for a improved process controls for the microelectronics industry. There is a further need for a metrology system that may be used to provide three dimensional (x-y verses height) topographical information with an accuracy sufficient for current and next generation microelectronics devices, with the ability to provide localized information and with a throughput speed sufficient to support in-line feedback and feed forward process control systems.

A method of controlling a process is described herein as including: developing intensity information I(x,y) corresponding to a feature on a surface; developing data corresponding to a three dimensional representation of the feature from the intensity information; developing a multiple parameter characterization of at least one critical dimension of the three dimensional representation; and controlling a process in response to the multiple parameter characterization. The process being controlled may be a downstream process applied to the surface in response to the multiple parameter characterization or a process used to develop a second feature on a second surface in response to the multiple parameter characterization. The method may further include: developing a function P(x) representative of a localized area of the surface as a function of I(x,y); and applying a transform function F(x) to the function P(x) to develop the data corresponding to the three dimensional representation of the feature. The transform function F(x) may be developed as a correlation between the function P(x) and a height vector H(x) representing the surface topography of the localized area or as a ratio of a multiple parameter characterization of the function P(x) and a multiple parameter characterization of the height vector H(x). The function P(x) may be developed by calculating P(x) as a weighted average intensity over the localized area across a plurality of scan lines according to the equation:

$$P(x) = \frac{\sum_{l=1}^{N} I(x,l)^* \left[ \frac{\sum_{m=1}^{N}\left(\frac{1}{1+\frac{|I(x,l)-I(x,m)|}{A}}\right)^3}{N} \right]^3}{\sum_{l=1}^{N}\left[ \frac{\sum_{m=1}^{N}\left(\frac{1}{1+\frac{|I(x,l)-I(x,m)|}{A}}\right)^3}{N} \right]^3}$$

where P(x) is the reduced amplitude modulated waveform, I(x) is the intensity matrix, N is the number of lines used to calculate the localized waveform, and A is one-half of the total range of the data set. The method may be applied when the feature is a photoresist feature on a first semiconductor substrate and wherein the process controlled is a lithography process.

In one embodiment a method of controlling microelectronic device manufacturing is described as including: developing a photoresist feature on a semiconductor substrate; using a scanning electron microscope to develop secondary electron signal intensity information I(x,y) corresponding to the photoresist feature; developing data corresponding to a three dimensional representation of the photoresist feature from the secondary electron signal intensity information; and developing a multiple parameter characterization of at least one critical dimension of the three dimensional representation. The method may further include controlling an etch process for the semiconductor wafer in response to the multiple parameter characterization.

In a further embodiment, a method of controlling a process is described as: using a scanning electron microscope to develop secondary electron signal intensity information corresponding to a final feature resulting from an etching process; developing data corresponding to a three dimensional representation of the final feature from the secondary electron signal intensity information corresponding to the final feature; developing a multiple parameter characterization of at least one critical dimension of the three dimensional representation of the final feature; and comparing the multiple parameter characterization of the final feature to device performance data.

A method of controlling a manufacturing process is described herein as including: developing intensity information I(x,y) corresponding to a feature on a surface; developing data corresponding to a three dimensional representation of the feature from the intensity information; developing a multiple parameter characterization of at least one critical dimension of the three dimensional representation; and comparing the multiple parameter characterization to a predetermined criteria for evaluating acceptability of the feature. When applied to a semiconductor device manufacturing process, the method may further include: characterizing scale information for the feature as a graph of the critical dimension versus height of the feature; identifying the predetermined criteria as an area on the graph; and evaluating acceptability of the feature by determining if the critical dimension versus height of the feature falls within the area on the graph.

An apparatus for controlling a process is described herein as including: a means for producing intensity data $I_N(x,y)$ corresponding to a feature on a surface; a means for producing data corresponding to a three dimensional representation of the feature as a function of the intensity data $I_N(x,y)$; a means for developing a multiple parameter characterization of at least one critical dimension of the three dimensional representation; and a processing apparatus responsive to the multiple parameter characterization. The processing apparatus may be responsive to the multiple parameter characterization to produce a second feature on a second surface or to further process the feature on the surface.

BRIEF DESCRIPTION OF THE DRAWINGS

The features and advantages of the present invention will become apparent from the following detailed description of the invention when read with the accompanying drawings in which.

DETAILED DESCRIPTION OF THE INVENTION

Figure 5:
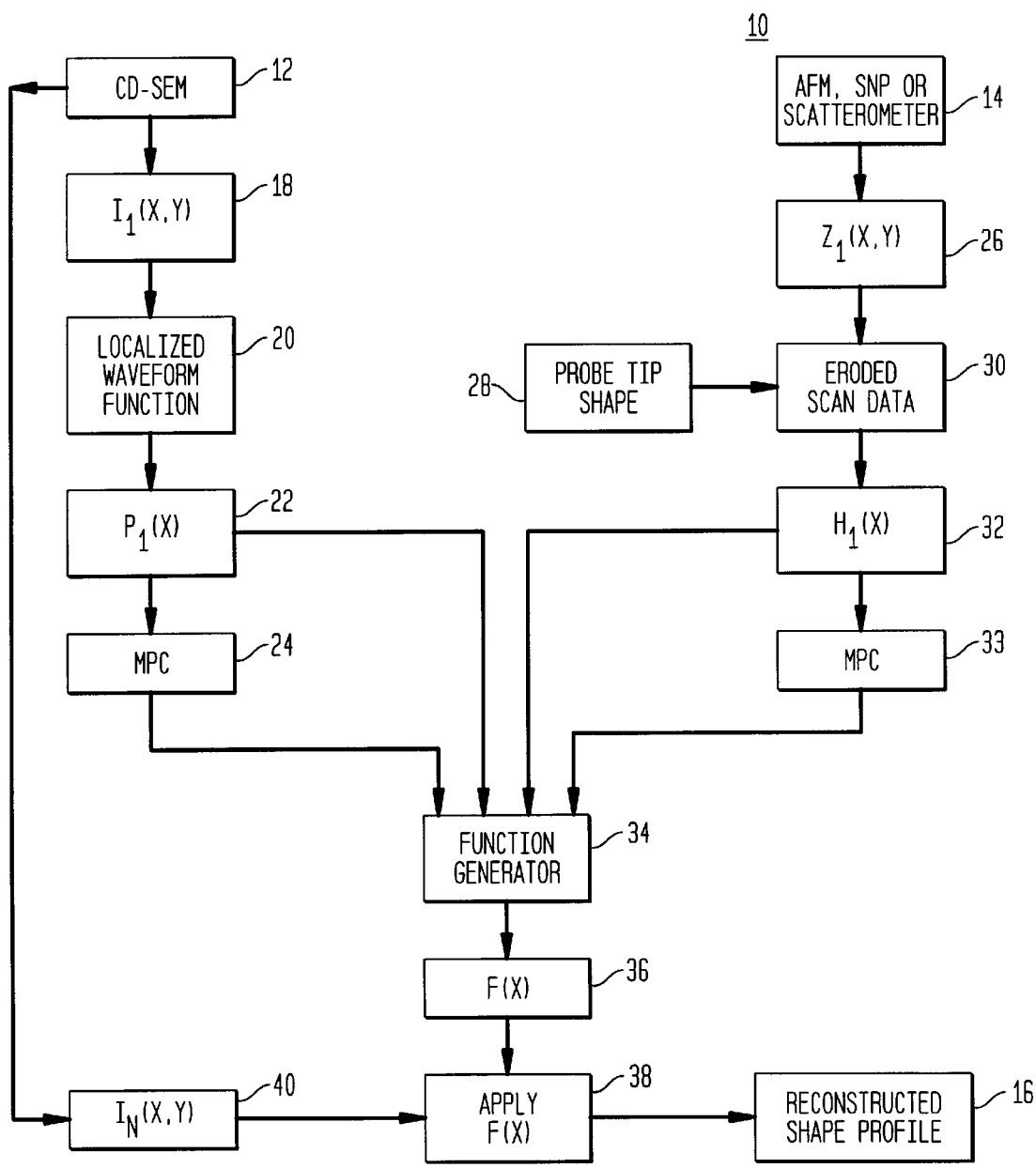
FIG. 5 illustrates an improved system for measuring the topography of the surface of a microelectronics substrate.

An improved system 10 for measuring the topography of the surface of a microelectronics substrate is schematically illustrated in FIG. 5. System 10 utilizes both a critical dimension scanning electron microscope (CDSEM) 12 and a stylus nanoprofilometer 14 to reconstruct a surface feature shape profile 16. The system 10 exhibits improved functionality for feedback and feed forward control when compared to the prior art single parameter and multiple parameter metrology systems.

The CDSEM 12 is used to scan the surface of a first substrate to produce a top down, i.e. plan view, image containing topographical information 18 represented by an intensity matrix $I_1(x,y)$, where x and y are axes normal to each other and parallel to the plane of the surface of the substrate. One may appreciate that an intensity matrix may be produced with other devices and the intensity may be based upon other planes of view, but in the present semiconductor manufacturing industry, the CDSEM is part of an installed equipment base upon which this invention may be built.

The topographic information contained in the intensity matrix 18 is processed through a localized waveform function 20 to obtain an amplitude modulated waveform 22 from a localized range, for example as described above with respect to Equation 1. Such traditional construction of the amplitude modulated waveform is an arithmetic mean over a large number of pixels. This creates ambiguities and has the effect of averaging out the detail held within the intensity matrix information. Alternatively, a correlation-based weighted arithmetic function that provides a reduced amplitude modulated waveform over a small number of pixel lines may be used, such as the function of Equation 2.

$$P(x) = \frac{\sum_{l=1}^{N} I(x,l)^* \left[ \frac{\sum_{m=1}^{N} \left( \frac{1}{1 + \frac{|I(x,l) - I(x,m)|}{A}} \right)^3}{N} \right]^3}{\sum_{l=1}^{N} \left[ \frac{\sum_{m=1}^{N} \left( \frac{1}{1 + \frac{|I(x,l) - I(x,m)|}{A}} \right)^3}{N} \right]^3} \quad (2)$$

P(x) is the reduced amplitude modulated waveform, I(x) is the intensity matrix, N is the number of lines used to calculate the localized waveform, and A is one-half of the total range of the data set (e.g. for an 8 bit pixel (0 to 255) or 2 to the eight power, the value of A would be 128). This equation was determined empirically. The exponential values can be modified to control the weighting of the function and a bounding criterion may also be used to eliminate outliers within the weighting portion of the function. Equation 2 is defined by way of example only. Other forms/functions may be equally suitable for other applications.

Figure 1A:
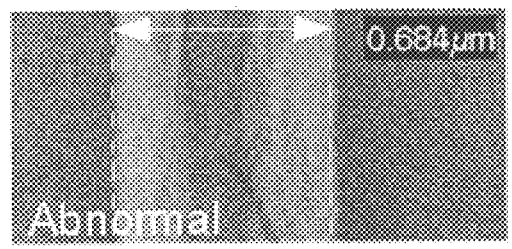
FIG. 1A is a scanning electron microscope top down image of a semiconductor wafer having an I-line metal photoresist with a normal morphology.
Figure 1B:
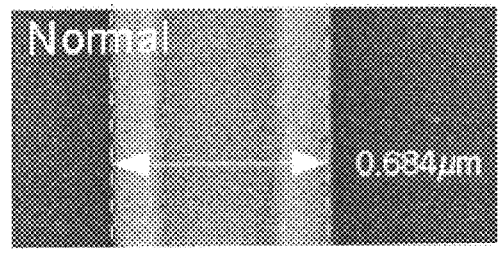
FIG. 1B is a prior art scanning electron microscope top down image of a semiconductor wafer having an I-line metal photoresist with an abnormal morphology.
Figure 2A:
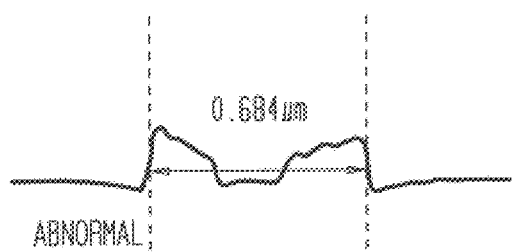
FIG. 2A is a prior art amplitude modulated waveform P(x) developed from the data of FIG. 1A.
Figure 2B:
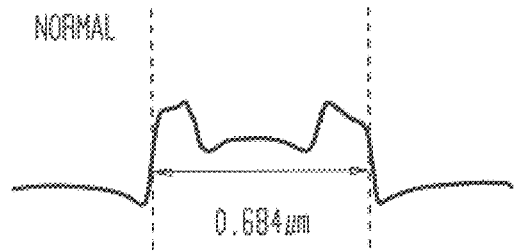
FIG. 2B is a prior art amplitude modulated waveform P(x) developed from the data of FIG. 1B.
Figure 3:
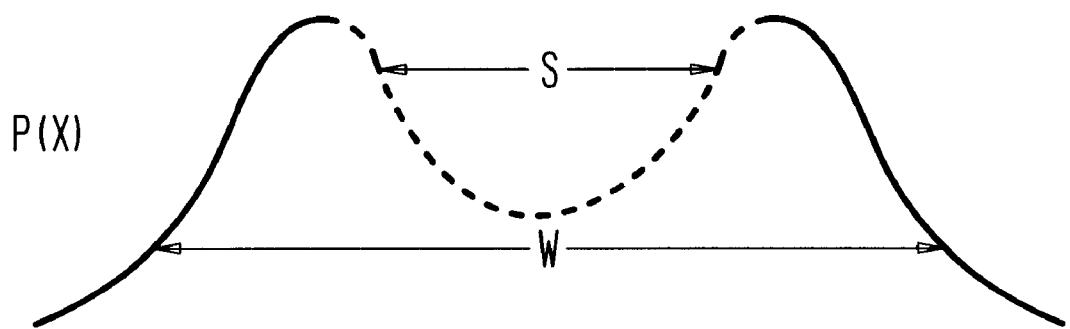
FIG. 3 is a prior art amplitude modulated waveform P(x) divided into two portions illustrating a width measurement W and a line space measurement S.
Figure 4:
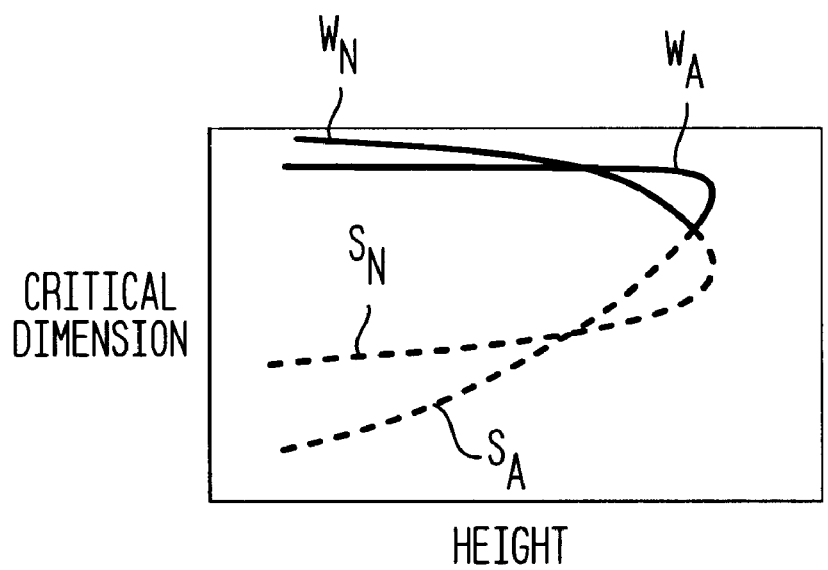
FIG. 4 is a prior art multiple parameter characterization of the data of FIGS. 2A and 2B illustrating the difference between normal and abnormal photoresist line morphologies.
Figure 9A:
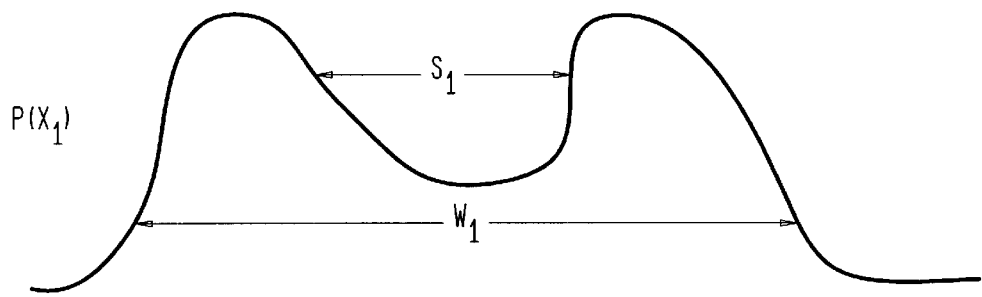
FIGS. 9A and 9B illustrate two different amplitude modulated waveforms having the same prior art MPC space and width characteristics.
Figure 9B:
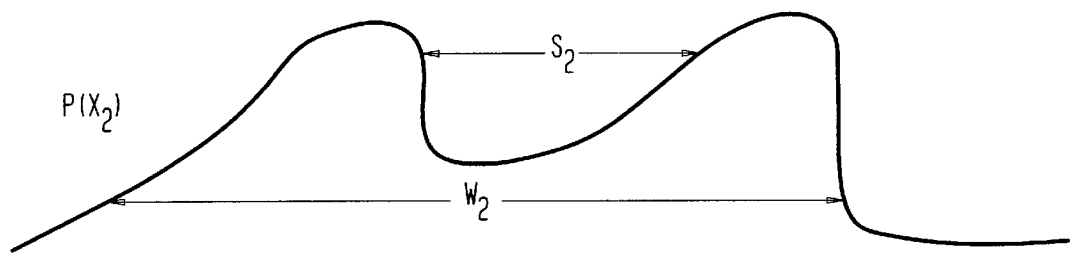
Figure 10:
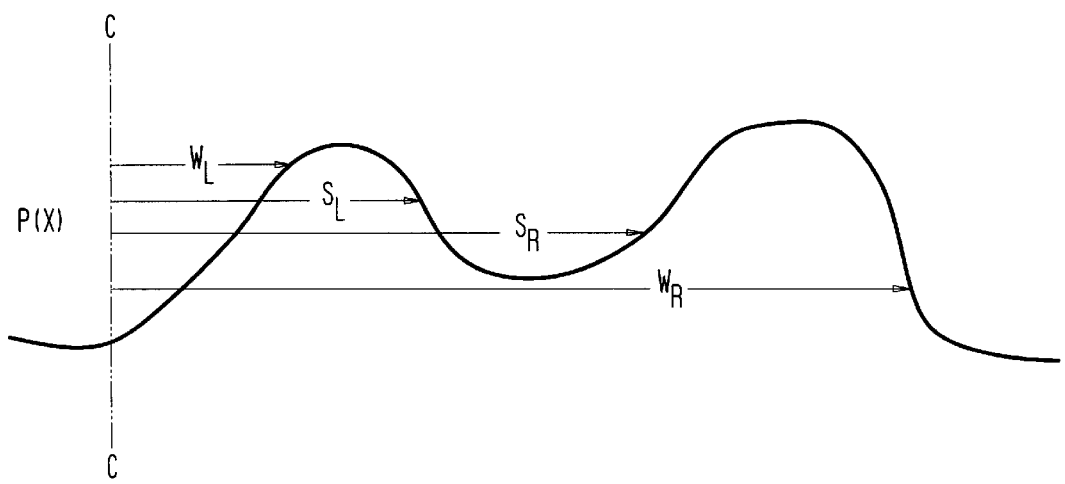
FIG. 10 illustrates an amplitude modulated waveform wherein a plurality of width and space dimensions are defined as dimensions from a central axis.
Figure 11:
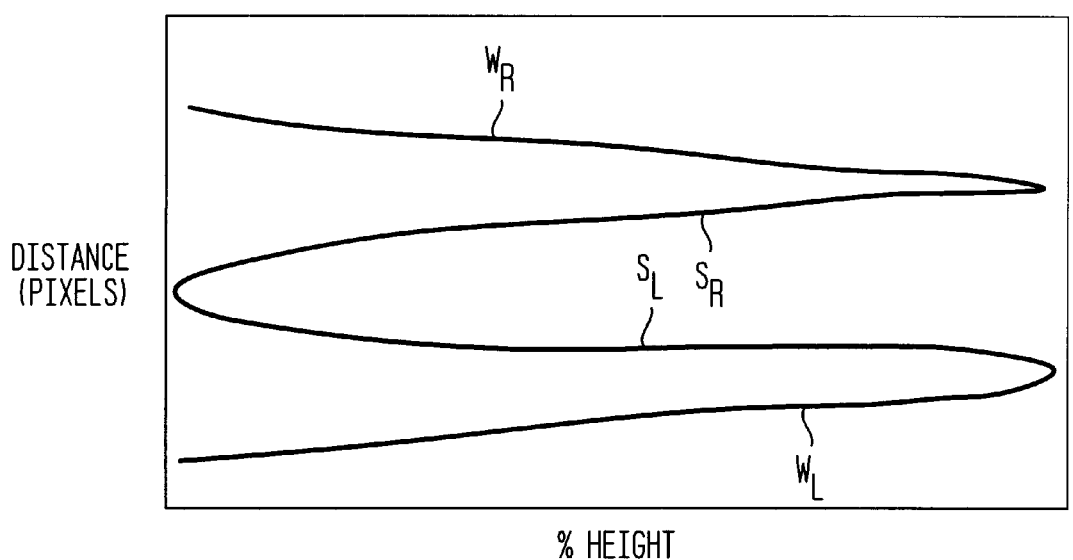
FIG. 11 is an MPC curve developed from the width and space dimensions of FIG. 10.

One or more multiple parameter characterizations 24 may be used to describe the information contained in the amplitude modulated waveform 22. Examples of such multiple parameter characterizations are described above with respect to FIG. 4. This type of prior art multiple parameter characterization describes the variation in space and width of the amplitude modulated waveform, but it is incapable of characterizing asymmetries in that waveform. A new type of MPC curve utilizes a deviation from a defined central (vertical) axis in the localized waveform function instead of the deviation of the width and space information. This is useful for all shapes/topographical features that are not identical with respect to their central (vertical) axis. The prior art MPCs of FIG. 4 will lose information for features which differ on either side of a central axis. For example, the two waveforms $P(X_1)$ and $P(X_2)$ of FIGS. 9A and 9B, respectively, have significant differences, yet may have the same space ($S_1$ and $S_2$) and width ($W_1$ and $W_2$) characteristics. An improved multiple parameter characterization of these such a waveform is developed by defining space and width dimensions from a defined axis such as axis C, as shown in FIG. 10. Four dimensions from axis C may be defined as the left width $W_L$, the left space $S_L$, the right space $S_R$, and the night width $W_R$. A two-humped MPC curve may be plotted for each of these dimensions, as shown in FIG. 11. FIG. 11 represents a new asymmetric MPC which maintains all the sidewall information separated from the left and right sidewalls with respect to the central axis. This asymmetric MPC is required to reconstruct function generators that are able to compensate for left-right sidewall differences and for functional dependence of the location of secondary electron detectors and asymmetries within lens components within the CDSEM that was used to generate the intensity data.

The first substrate is also examined with the stylus nanoprofilometer 14 to produce a topographic map 26 of the substrate surface. The probe tip shape 28 is known from the results of scans over characterizers having known shapes. The probe tip shape 28 is used at step 30 to evaluate topographic map $Z_1(x,y)$ to develop a height vector $H(x)$ at step 32. One may appreciate that height vector $H_1(x)$ represents two dimensional topographical information. Other techniques may be used to obtain the height matrix $H_1(x)$. For example, the height vector information may be obtained by elipsometry or a scatterometer may be used. Further, a multiple parameter characterization 33 of the height vector may be developed.

A transform function generator is used at step 34 to define a transform function $F(x)$ 36 useful to transform the CDSEM information to the height vector $H_1(x)$. The MPC 24 of the amplitude modulated waveform or the amplitude modulated waveform itself 22 may be used as input to the function generator 34. Similarly, the MPC 33 of the height information or the height vector 33 itself may be used as input. The transform function $F(x)$ 36 may subsequently be applied at step 38 to reconstruct the sample surface from the amplitude modulated waveforms 40 of the additional substrates numbered 2 through N that may later be processed through the CDSEM 12. The resultant reconstructed shape profile 16 will differentiate normal and abnormal morphologies and may be used for both dimensional verification and process control purposes. By combining the speed and precision of the scanning electron microscope with a highly accurate measuring tool, such as the SPM, SNP, scatterometer, elipsometry device or even destructive examination, one obtains a system that is capable of supporting the metrology needs of the next generation of semiconductor processes without having to make a large capital expenditure to replace the exiting SEM infrastructure. This combined technology system uses the SEM to obtain localized information corresponding to a surface feature, then uses a function generator to provide a transform function developed from the more accurate (e.g. SNP) data to position the localized information on the feature.

It is possible at step 34 to construct many different transforms $F(x)$ between the intensity profile MPC and the height vector 32. The simplest is a ratio based transform of MPC $H(x)$ 33 to MPC $P(x)$ 24. While this transform has limited range for the purposes of inline metrology, that range is sufficient for the purpose of microelectronics device characterization. Even if the reconstruction of grossly out of shape features is incorrect, the methodology will identify the shape change and will flag the profile as resulting from a deviant morphology. A scanning probe microscope, such as SNP 14, may then be used for subsequent imaging of poorly shaped features for more detailed analysis. Normally, at the resist level, the exact morphology of extremely deviant shapes is not needed. Functional based transforms or neural net based transforms may be used rather than a correlation based transform. The transform function generator may be embodied as hardware and/or software, as is known in the art. For example, a personal computer having programmed instructions for calculating the above described ratio may be used.

Figure 6:
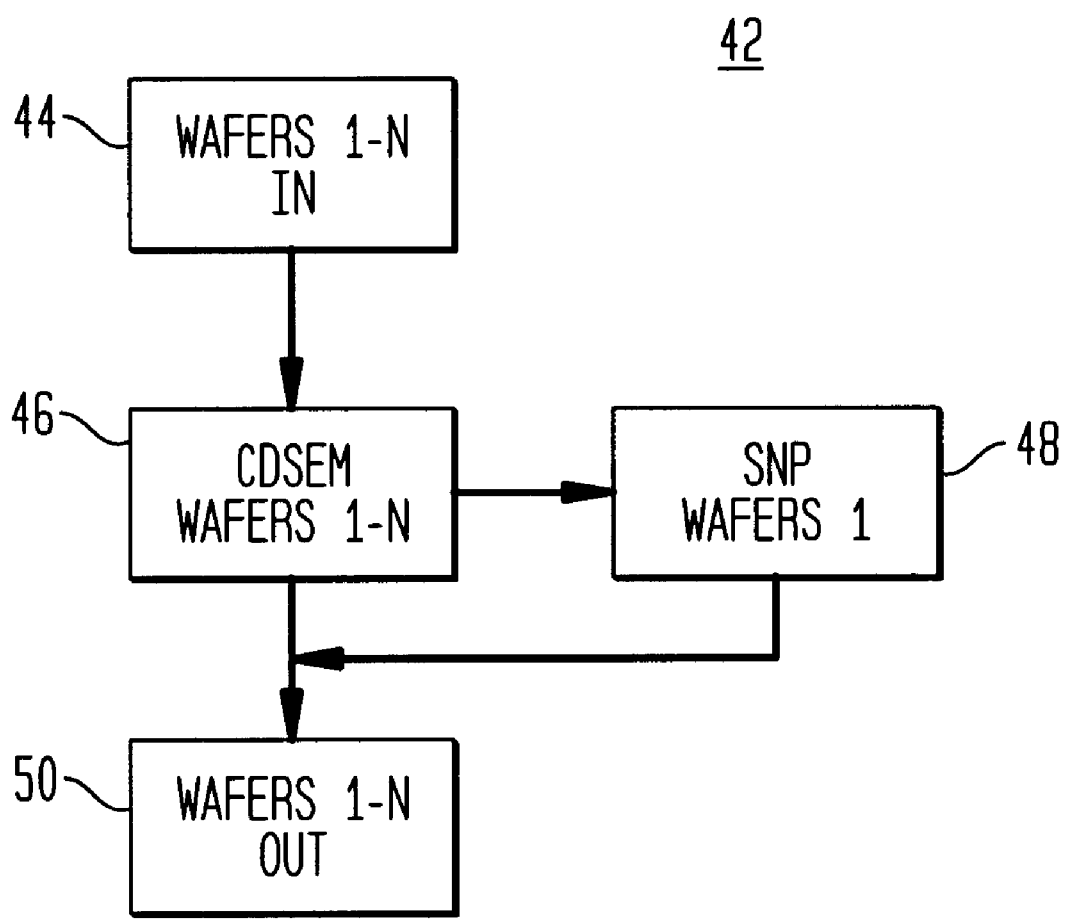
FIG. 6 is a flow chart illustrating the flow of semiconductor wafers in the metrology system of FIG. 5.

FIG. 6 illustrates the metrology process flow 42 of semiconductor wafers in a clean room manufacturing environment utilizing the system 10 of FIG. 5. A plurality of N semiconductor wafers is received at step 44. All N of the wafers are inspected with a top down CDSEM at step 46. One of the wafers is also subjected to inspection with a stylus nanoprofilometer at step 48. Alternatively, other types of inspections may be used at step 48 to obtain information representing the topography of the surface of the wafer using a technique having an accuracy grater than the accuracy provided by the top down scanning electron microscope. Such other techniques may include destructive examination, atomic force microscope, etc. The wafers are all processed out at step 50 with a reconstructed shape profile being developed for each of the wafers 2-N based upon a transform function defined by the CDSEM and SNP information from the first wafer.

Figure 7:
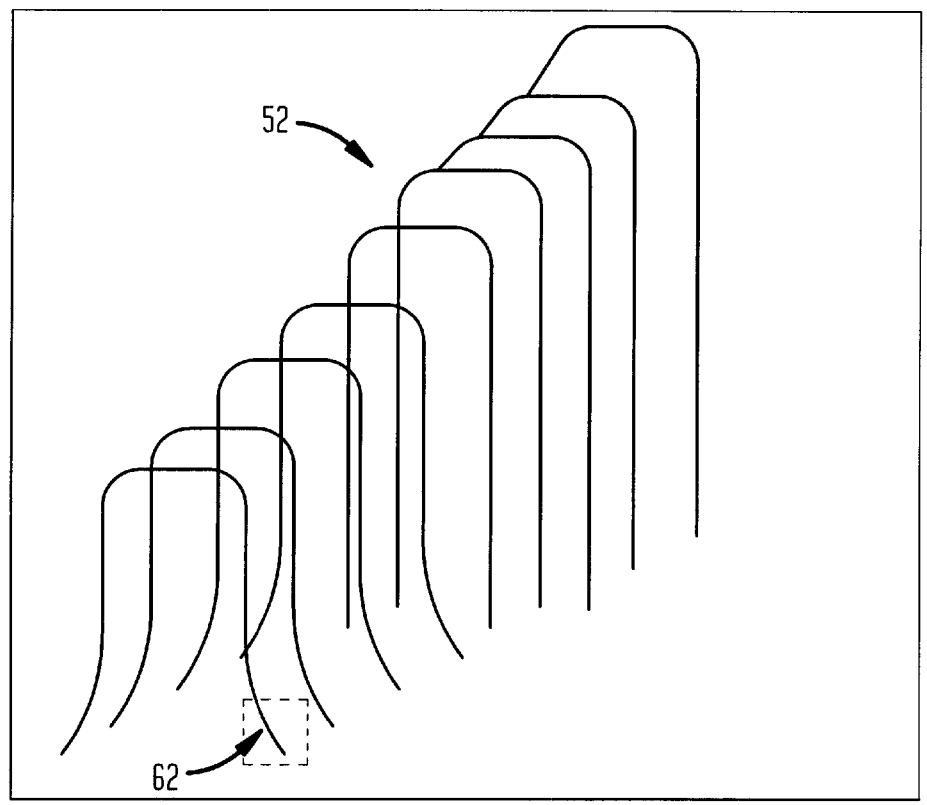
FIG. 7 is a virtual three dimensional feature profile reconstructed from a height vector and a CDSEM intensity map.
Figure 8:
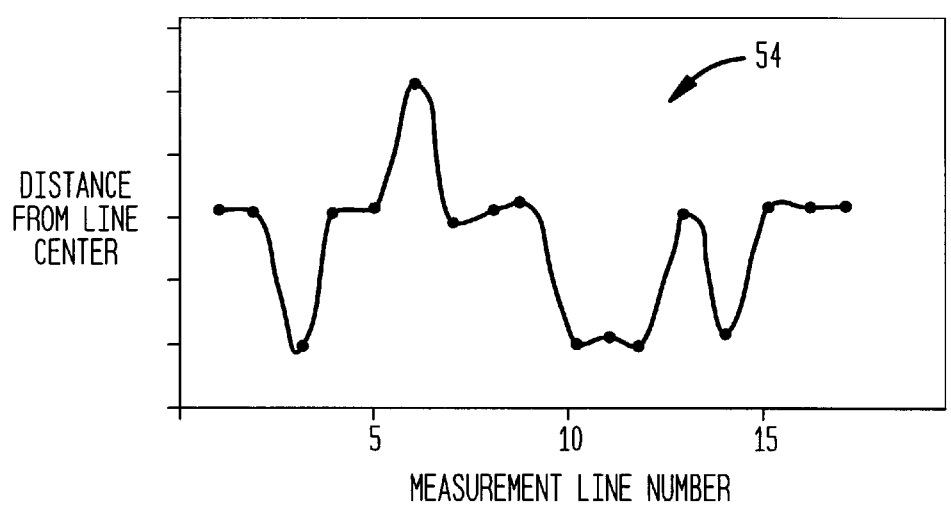
FIG. 8 illustrates a line edge roughness curve developed from the left hand side wall of FIG. 7.
Figure 12:
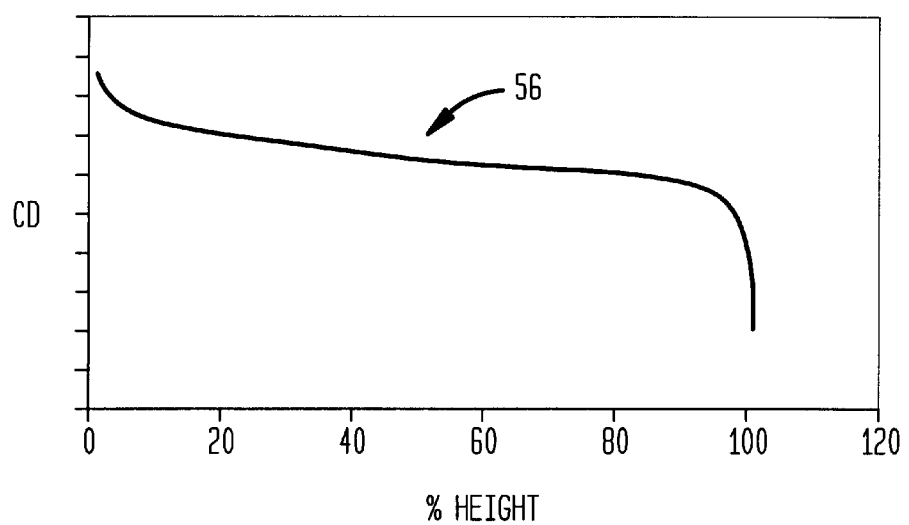
FIG. 12 is a multiple parameter characterization of the virtual profile of FIG. 7 showing critical dimension versus percent height of the feature.
Figure 13:
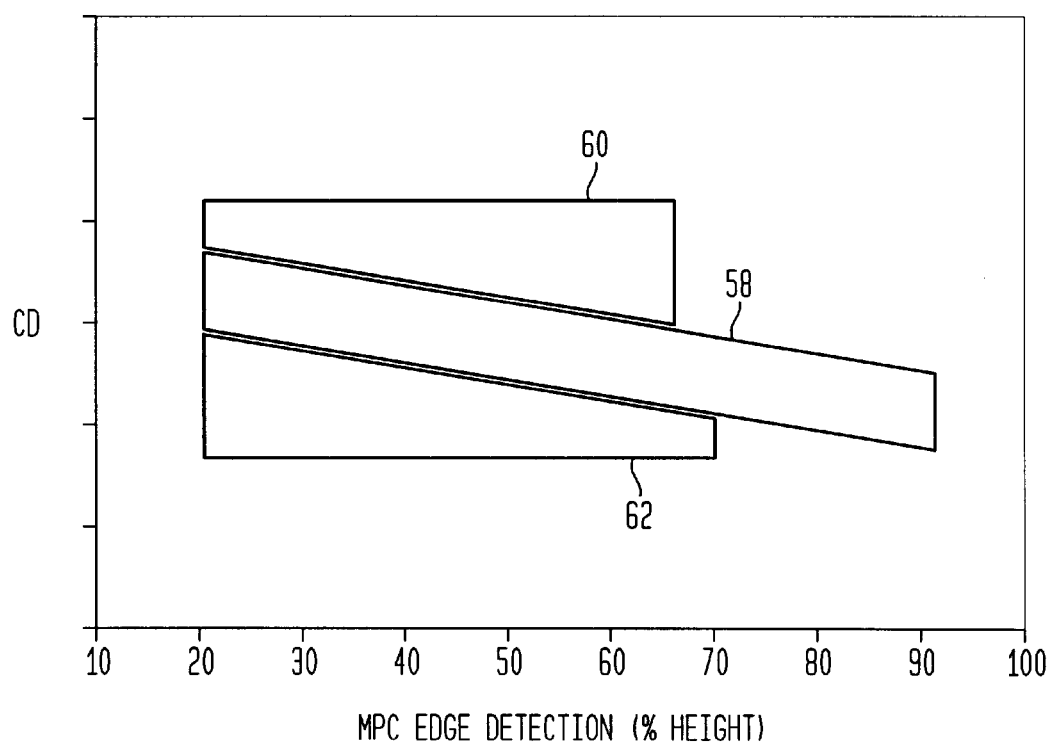
FIG. 13 illustrates acceptance and deviation bins for the MPC data of FIG. 12.

The shape of a substrate feature may thus be represented as either a cross sectional or three dimensional representation of the intensity waveform to create a virtual cross section. FIG. 7 illustrates one example of a three dimensional reconstructed (TDR) profile 52 of a metal line on a semiconductor wafer that has been reconstructed from a height vector $H(x)$ and a CDSEM intensity map $I(x,y)$. Any variety of metrology data may be generated from these three dimensional reconstruction values. For example, FIG. 8 illustrates a line edge roughness curve 54 of the left hand side wall of FIG. 7 at 50% of wall height. FIG. 12 illustrates how scale of the feature may be represented by a multiple parameter characterization rather than a single parameter characterization. Scale information may be represented by a graph of critical dimension versus percent height of the feature, by critical dimension versus height of the feature, by critical dimension from a central axis versus percent height of the feature, or by critical dimension from the central axis versus height of the feature, as examples. FIG. 12 illustrates a plot 56 of critical dimension versus percent height of the feature. A plurality of such curves may be developed for a plurality of different cross-sections of the virtual feature of FIG. 7. Furthermore, a methodology for templating these new statistical process control monitors may be constructed, as shown in FIG. 13. A first window or bin 58 of acceptable values may be defined. Any plot 56 of metrology data falling outside of the acceptance bin 58 would indicate a failed part or process. A deviation bin 60 may be defined as a predefined range of values in a particular area of the reconstructed profile falling outside of the bin 58 of acceptable values, such as the footing area 62 illustrated in FIG. 7. The size and shape of the acceptance bin 58 may be dependent upon the criticality of the dimension to device performance. Other deviation bins 62 may be defined to trigger specific process parameter changes, such as a change in an upstream process parameter to bring a drifting process back into a preferred range, or a change in a downstream process parameter that is selected to counteract a specific shape deviation. For example, a predetermined deviation bin may correspond to a known photolithography mask feature shape deviation for which a downstream compensation can be made by increasing the oxygen flow rate during a subsequent etching process. Alternatively, a deviation bin may be identified to trigger an upstream change in a lithography focus or exposure parameter.

It is also possible to vary the size and shape of the acceptance bin 58 or any deviation bin 60,62 based upon a learning process. In one embodiment, one or more neural networks may be trained for feedback/feed forward control of a semiconductor manufacturing process from post-etch feature shapes and sizes. One such learning process control network is described in co-pending, commonly owned United States patent application Serial Number (NOT YET ASSIGNED), filed on the same day as the present invention (attorney docket Houge 25-24-17, inventors Houge, Mcintosh and Reitman), the disclosure of which is hereby incorporated by reference herein.

Figure 14:
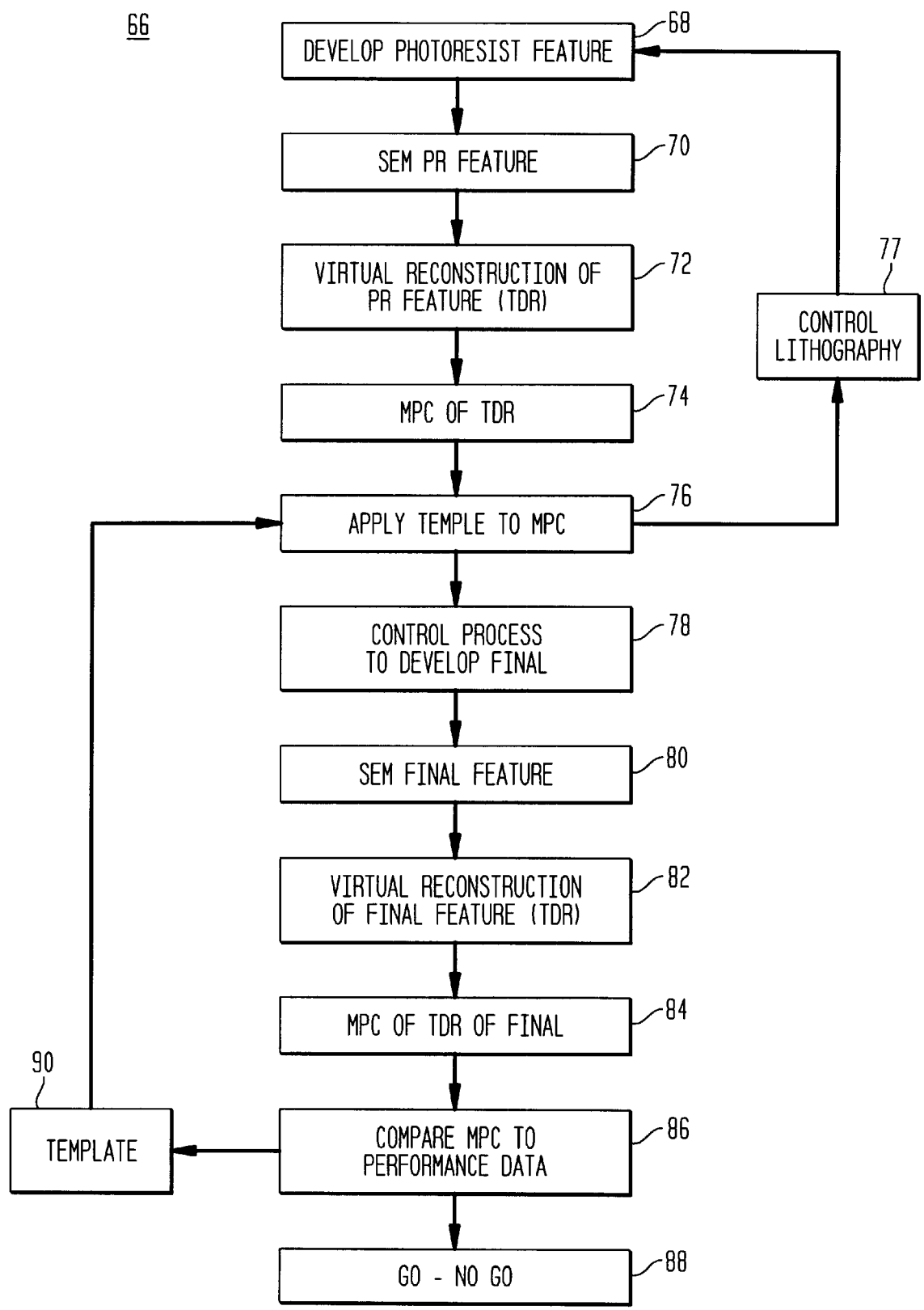
FIG. 14 is a flow diagram for a semiconductor manufacturing process wherein multiple parameter characterizations of three dimensional reconstructed feature shapes are used for both the control of a downstream etch process and for training a learning process to refine a quality control template.

The process and system described above provides a more accurate metrology than prior art processes and systems by averaging out the errors inherent in the SEM tool while developing a "virtual" physical shape. SEM data is very precise, but the data is not repeatable over time, i.e. not accurate, due to operational variability, machine location, etc. SEM data from different batches or different machines can not be compared due to this lack of accuracy. The present process and system removes the variability of SEM data between the photoresist and a resulting metal line through the use of three dimensional reconstructed shapes. By using SEM data to create a virtual physical shape, the accuracy is increased. This increased accuracy may be used to accommodate a greater variation in the photoresist geometry by adjusting a downstream process parameter, thereby effectively widening process control windows and allowing a greater process variability while facilitating improved control of the overall manufacturing process. FIG. 14 illustrates a semiconductor manufacturing process and system 66 incorporating these ideas. A photoresist feature is developed on a semiconductor wafer at step 68. A scanning electron microscope is used at step 70 to obtain intensity information of the photoresist feature, and a virtual reconstruction of the photoresist feature is developed at step 72 by applying a transform function as described above with respect to FIG. 5. An MPC of the reconstructed feature 74 is applied to a template 76 to define an etching process control parameter for developing a final feature 78 on the wafer surface. This step may further be used to identify the need for adjusting an upstream lithography control parameter 77 in order to account for a drifting process or to effect any other desired change. The final feature is scanned with an SEM device 80 and a virtual reconstruction of the final feature is developed at step 82. A multiple parameter characterization of the virtual final feature developed at step 84 may be compared to performance data 86 for developing a go/no-go gate 88, and may further be used to develop/refine the template 90 used in step 76 for controlling the etching process. Template 90 may be a physical or numeric representation of parameters. The performance data may be historical data and/or it may be performance data for the individual wafer. Thus the system 66 enables the development of feed-forward and feedback controls based on SEM inspection data by removing the inaccuracies normally associated with such data. Accordingly, the installed industry-wide SEM equipment inventory may be used to support the production of the next generation of microelectronics devices with improved yields resulting from in-line process control.

While the preferred embodiments of the present invention have been shown and described herein, it will be obvious that such embodiments are provided by way of example only. Numerous variations, changes and substitutions will occur to those of skill in the art without departing from the invention herein. Accordingly, it is intended that the invention be limited only by the spirit and scope of the appended claims.

We claim as our invention:

1. A method of controlling a process, the method comprising:
    developing intensity information I(x,y) corresponding to a feature on a surface;
    developing data corresponding to a three dimensional representation of the feature from the intensity information;
    developing a multiple parameter characterization of at least one critical dimension of the three dimensional representation; and
    modifying a process in response to the multiple parameter characterization.

2. The method of claim 1, further comprising controlling a downstream process applied to the surface in response to the multiple parameter characterization.

3. The method of claim 1, further comprising controlling a process used to develop a second feature on a second surface in response to the multiple parameter characterization.

4. The method of claim 1, further comprising:
    developing a function P(x) representative of a localized area of the surface as a function of I(x,y);
    applying a transform function F(x) to the function P(x) to develop the data corresponding to the three dimensional representation of the feature.

5. The method of claim 4, further comprising developing the transform function F(x) as a correlation between the function P(x) and a height vector H(x) representing the surface topography of the localized area.

6. The method of claim 5, further comprising developing the transform function F(x) as a ratio of a multiple parameter characterization of the function P(x) and a multiple parameter characterization of the height vector H(x).

7. The method of claim 4, wherein the step of developing a function P(x) comprises calculating P(x) as a weighted average intensity over the localized area across a plurality of scan lines.

8. The method of claim 7, further comprising calculating P(x) according to the equation:

$$P(x) = \frac{\sum_{l=1}^{N} I(x,l)^* \left[ \frac{\sum_{m=1}^{N}\left(\frac{1}{1+\frac{|I(x,l)-I(x,m)|}{A}}\right)^3}{N} \right]^3}{\sum_{l=1}^{N} \left[ \frac{\sum_{m=1}^{N}\left(\frac{1}{1+\frac{|I(x,l)-I(x,m)|}{A}}\right)^3}{N} \right]^3}$$

where P(x) is the reduced amplitude modulated waveform, I(x) is the intensity matrix, N is the number of lines used to calculate the localized waveform, and A is one-half of the total range of the data set.

9. The method of claim 1, wherein the feature is a photoresist feature on a first semiconductor substrate, and wherein the process controlled is a lithography process.

10. A method of controlling microelectronic device manufacturing comprising:
    developing a photoresist feature on a semiconductor substrate;
    using a scanning electron microscope to develop secondary electron signal intensity information I(x,y) corresponding to the photoresist feature;
    developing data corresponding to a three dimensional representation of the photoresist feature from the secondary electron signal intensity information;
    developing a multiple parameter characterization of at least one critical dimension of the three dimensional representation; and
    controlling a process in response to the multiple parameter characterization.

11. The method of claim 10, further including controlling an etch process for the semiconductor wafer in response to the multiple parameter characterization.

12. A method of controlling a semiconductor device manufacturing process comprising:
    developing intensity information I(x,y) corresponding to a feature on a surface;
    developing data corresponding to a three dimensional representation of the feature from the intensity information;
    developing a multiple parameter characterization of at least one critical dimension of the three dimensional representation; and
    comparing the multiple parameter characterization to a predetermined criterion.

13. The method of claim 12, further comprising characterizing one of shape and scale information for the feature as a function of critical dimension verses height of the feature.

14. The method of claim 13, further comprising:
    characterizing the one of shape and scale information as a graph; and
    identifying the predetermined criteria as an area on the graph.

15. The method of claim 12, further comprising:
    using a scanning electron microscope to develop secondary electron signal intensity information corresponding to a final feature resulting from an etching process;
    developing data corresponding to a three dimensional representation of the final feature from the secondary electron signal intensity information corresponding to the final feature;
    developing a multiple parameter characterization of at least one critical dimension of the three dimensional representation of the final feature; and
    correlating the multiple parameter characterization of the final feature to device performance data.

16. The method of claim 12, further comprising using the step of comparing to develop a template for controlling an etching process.

17. The method of claim 12, further comprising using the multiple parameter characterization to control a photoresist development process for developing a photoresist feature on a subsequently processed semiconductor wafer.

18. An apparatus for controlling a process, the apparatus comprising:
    a means for producing intensity data $IN(x,y)$ corresponding to a feature on a surface;
    a means for producing data corresponding to a three dimensional representation of the feature as a function of the intensity data $I_N(x,y)$;
    a means for developing a multiple parameter characterization of at least one critical dimension of the three dimensional representation; and
    a processing apparatus responsive to the multiple parameter characterization.

19. The apparatus of claim 18, wherein the processing apparatus is responsive to the multiple parameter characterization to produce a second feature on a second surface.

20. The apparatus of claim 18, wherein the processing apparatus is responsive to the multiple parameter characterization to further process the feature on the surface.

* * * * *